United States Patent

Shimazu et al.

[11] Patent Number: 5,775,219
[45] Date of Patent: Jul. 7, 1998

[54] SQUEEGEE FOR SCREEN PRINTING

[75] Inventors: Hiroshi Shimazu; Yoshihiro Kobayashi; Eiji Sakata, all of Fukuoka-Ken, Japan

[73] Assignee: Kyushu Hitachi Maxell, Ltd., Fukuoka-ken, Japan

[21] Appl. No.: 764,625

[22] Filed: Dec. 11, 1996

[30] Foreign Application Priority Data

Dec. 13, 1995 [JP] Japan .................................. 7-347262
Dec. 14, 1995 [JP] Japan .................................. 7-348067

[51] Int. Cl.$^6$ ...................................... B41F 15/44
[52] U.S. Cl. ................................ 101/123; 101/124
[58] Field of Search ............................ 101/123, 124, 101/127, 157, 169, 119, 120; 15/256.5, 256.51, 256.53

[56] References Cited

U.S. PATENT DOCUMENTS 4,940,354  7/1990  Holderegger et al.
5,027,703  7/1991  Hancy.
5,099,783  3/1992  Bourgeois ............................. 101/123
5,107,759  4/1992  Omori et al.

Primary Examiner—Ren Yan
Attorney, Agent, or Firm—Birch, Stewart, Kolasch & Birch, LLP

[57] ABSTRACT

A squeegee (K1-K3) for screen printing, comprising: a squeegee body (1) which is formed by a metal sheet and has a squeegeeing face (1a) and a convexly curved pressing edge (3) on the squeegeeing face (1a); wherein when the squeegee (K1-K3) is set for squeegeeing such that the squeegeeing face (1a) is oriented in a travelling direction (X) of the squeegee (K1-K3), a center (O) of curvature of the convexly curved pressing edge (3) extends substantially horizontally.

10 Claims, 11 Drawing Sheets

SQUEEGEE FOR SCREEN PRINTING

BACKGROUND OF THE INVENTION

The present invention relates to a squeegee for a screen printing process, which is used for, for example, printing solder paste on a printed-wiring board for IC and LSI chips or thickly printing electrically conductive ink of copper or the like on various circuit boards including a hybrid IC and a ceramic multi-layer board, a composite ceramic electronic component including a high-frequency filter and various electronic components during their production.

In case the squeegee of this kind is used for printing solder paste, the squeegee is generally made of urethane rubber. However, recently, a unitary member in which urethane rubber and a metal sheet are formed integrally with each other is proposed as the squeegee therefor. A free end of the squeegee has a swordlike, angular or flat shape. As shown in FIG. 1, solder paste 32 is printed on a printed-wiring board 30 by using such a squeegee 40. A screen mask 31 is depressed against the printed-wiring board 30 upon displacement of the squeegee 40 such that the solder paste 32 is printed on the printed-wiring board 30 through the screen mask 31. However, the solder paste 32 is obtained by compounding active flux with Sn—Pb series solder alloy and kneading the compound and thus, has high viscosity. Therefore, if the solder paste 32 is not rolled sufficiently by the squeegee 40 at the time of squeegeeing, filling of the solder paste 32 into openings 33 of the screen mask 31 deteriorates, thereby resulting in poor printing property.

Furthermore, a problem may arise at the time the squeegee 40 is set on the screen mask 31 prior to starting of a printing process. In this case, a force (buckling load) W is applied to the squeegee 40 as shown in FIG. 2 so as to bring the squeegee 40 into parallel with the screen mask 31. As a result, the squeegee 40 is subjected to buckling and thus, a free end 40a of the squeegee 40 is bent in a travelling direction X of the squeegee 40 or its opposite direction. In case the free end 40a of the squeegee 40 is bent in the direction opposite to the travelling direction X of the squeegee 40, the direction opposite to the travelling direction X of the squeegee 40 coincides with a direction in which the squeegee 40 is deflected by printing pressure, so that no problem is offered. However, if the free end 40a of the squeegee 40 is bent in the travelling direction X of the squeegee 40, the solder paste 32 is not scraped smoothly and stably by the squeegee 40, so that squeegeeing is not performed properly and thus, the squeegee 40 is required to be set again. Especially, as a free end of the squeegee 40 is thinner as in a metal squeegee or a swordlike squeegee or squeegeeing angle approximates further to 90°, direction of deflection of the free end 40a of the squeegee 40 becomes more uncertain. This uncertainty of direction of deflection of the free end 40a of the squeegee 40 becomes conspicuous at the time electrically conductive ink or the like is printed on an electronic component by using a screen mesh.

SUMMARY OF THE INVENTION

Accordingly, an essential object of the present invention is to provide, with a view to eliminating the above mentioned disadvantages of prior art squeegees, a squeegee for screen printing, in which a pressing edge has a special shape so as to improve rolling property and printing property of solder paste.

Another object of the present invention is to provide a squeegee which can be at all times so set as to orient the pressing edge in a predetermined direction suitable for squeegeeing such that reliability of setting of the squeegee is raised.

In order to accomplish the first object of the present invention, a squeegee for screen printing, according to one embodiment of the present invention comprises: a squeegee body which is formed by a metal sheet and has a squeegeeing face and a convexly curved pressing edge on the squeegeeing face; wherein when the squeegee is set for squeegeeing such that the squeegeeing face is oriented in a travelling direction of the squeegee, a center of curvature of the convexly curved pressing edge extends substantially horizontally.

In accordance with the one embodiment of the present invention, since the pressing edge of the squeegee body is curved convexly such that the center of curvature of the convexly curved pressing edge extends substantially horizontally when the squeegee is set substantially vertically for squeegeeing, position of line of contact between the convexly curved pressing edge and surface of a screen mask can be changed continuously in response to progress of squeegeeing. As a result, since wear occurs at a number of locations of the convexly curved pressing edge, service life of the squeegee body is lengthened and printing pressure can be made substantially constant.

Meanwhile, since solder paste coming into contact with the squeegeeing face of the squeegee body at the time of squeegeeing is urged by the squeegee to rotate from an upper portion of the convexly curved pressing edge towards a boundary portion between the convexly curved pressing edge and the squeegeeing face, the solder paste is rolled satisfactorily and thus, is smoothly fitted into openings of a screen mask.

Furthermore, since thickness of a free end of the squeegee body can be increased by providing the convexly curved pressing edge, deformation of the free end of the squeegee body can be lessened. Therefore, such a problem due to such deformation of the free end of the squeegee body can be eliminated that the solder paste remains on the surface of the screen mask without being scraped by the squeegee.

On the other hand, in order to achieve the second object of the present invention, a squeegee for screen printing, according to a further embodiment of the present invention comprises: a squeegee body which is formed by a metal sheet and has a squeegeeing face curved convexly as a whole; wherein when the squeegee is set for squeegeeing such that the squeegeeing face is oriented in a travelling direction of the squeegee, a center of curvature of the squeegeeing face extends substantially horizontally.

In accordance with the further embodiment of the present invention, the squeegeeing face of the squeegee body is curved convexly as a whole such that the center of curvature of the convexly curved squeegeeing face extends substantially horizontally when the squeegee is set substantially vertically for squeegeeing. Therefore, even if the squeegee body is subjected to bending load through its buckling when the squeegee body is set on the screen mask, the squeegee body is merely bent further than its initial bending, so that a free end of the squeegee body is kept facing in a direction opposite to a travelling direction of the squeegee without changing its direction. Therefore, the squeegee can be advantageously set for squeegeeing such that the free end of the squeegee body is oriented in the direction opposite to the travelling direction of the squeegee at all times.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
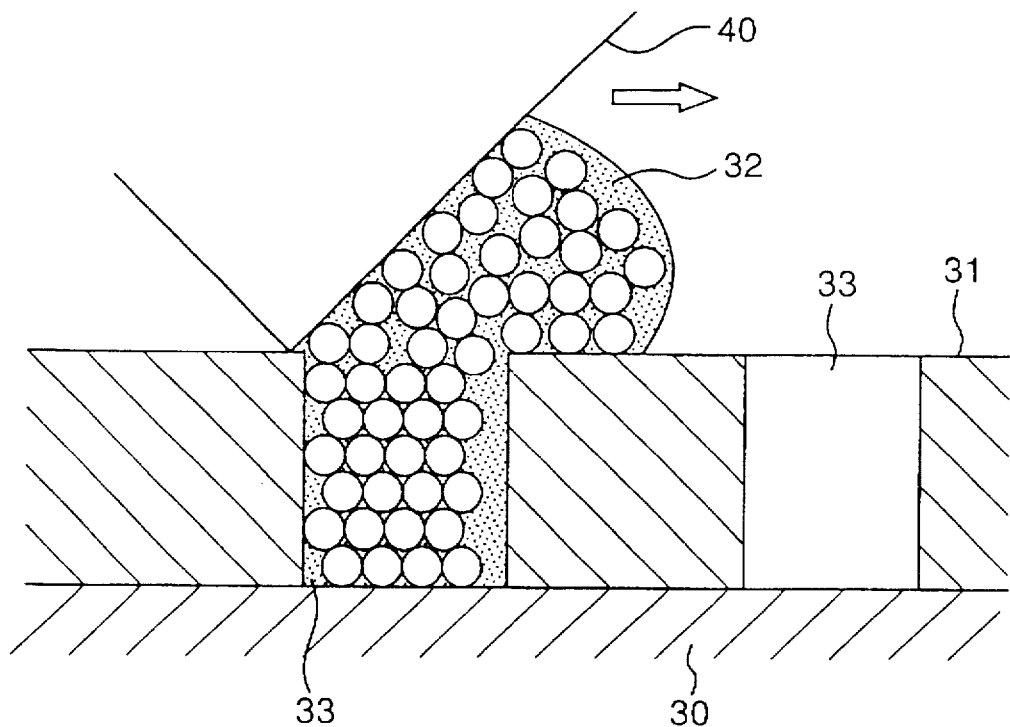
FIG. 1 is a view showing a printing process utilizing a prior art squeegee (already referred to)
Figure 2:
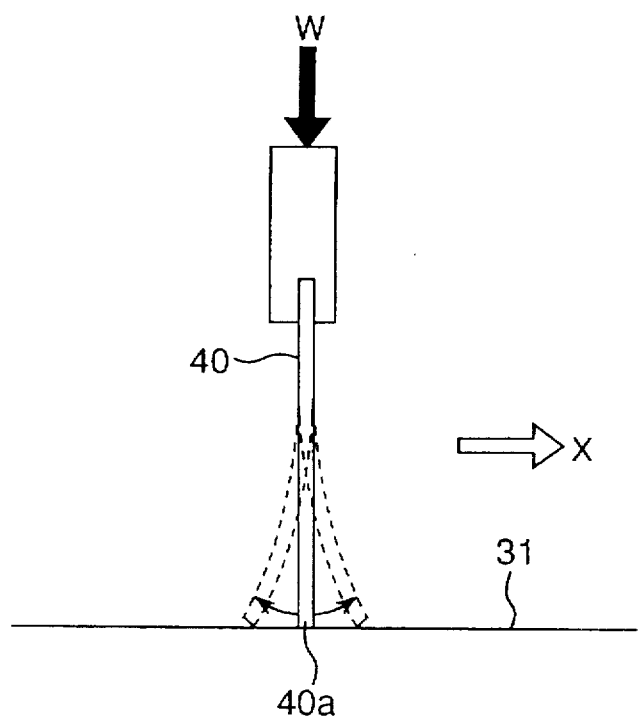
FIG. 2 is a side elevational view showing setting of the prior art squeegee of FIG. 1 (already referred to)
Figure 3:
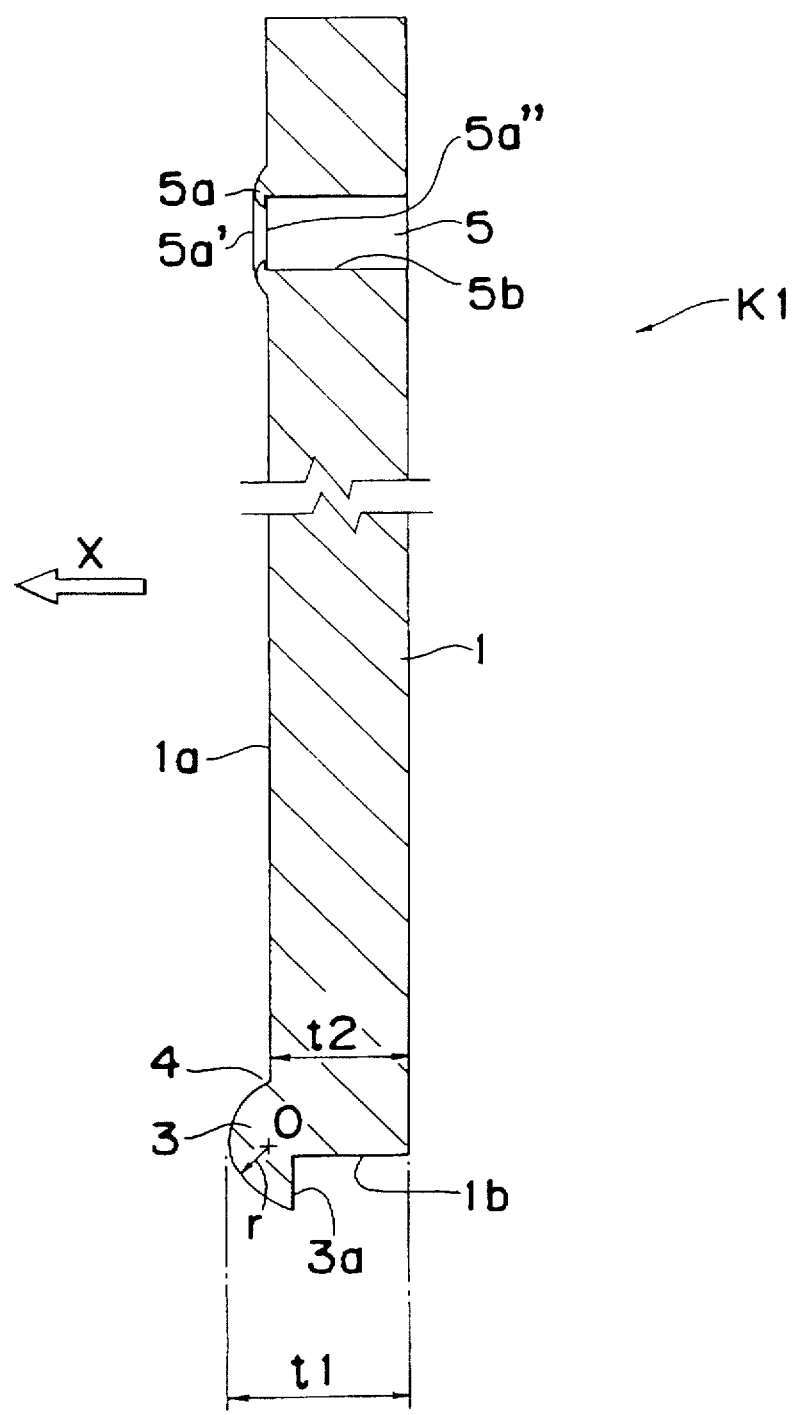
FIG. 3 is a vertical sectional view of a squeegee body of a squeegee according to a first embodiment of the present invention.
Figure 4:
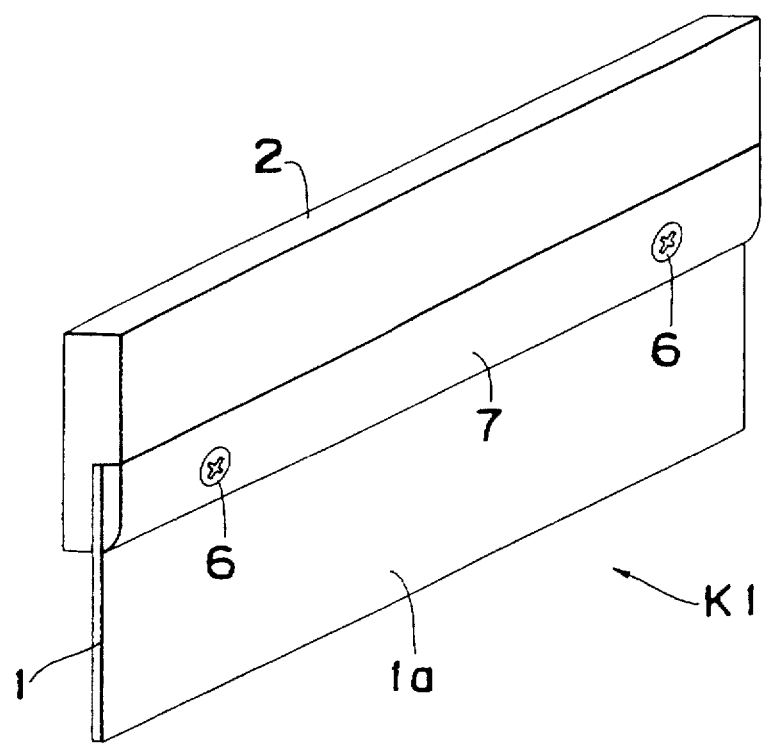
FIG. 4 is a perspective view of the squeegee of FIG. 3.

Hereinafter, a squeegee K1 for screen printing, according to a first embodiment of the present invention is described with reference to FIGS. 3 to 8A and 8B. In the squeegee K1, a squeegee body 1 of FIG. 3 is attached to a holder 2 as shown in FIG. 4. The squeegee body 1 is formed by an elongated metal sheet. As shown in FIG. 3, one of opposite faces of the squeegee body 1 is oriented in a travelling direction X of the squeegee K1 at the time of squeegeeing and is referred to as a "squeegeeing face" 1a. An edge of the squeegee body 1, which is defined by a free end 1b and the squeegeeing face 1a of the squeegee body 1, functions as a pressing edge for squeegeeing.

A protuberance 3 having a convexly curved sectional shape is provided at the pressing edge of the squeegee body 1 so as to protrude outwardly from the squeegeeing face 1a and the free end 1b. Thus, the protuberance 3 has an overhang portion 3a protruding outwardly from the free end 1b. The protuberance 3 has a radius r of curvature and a center O of curvature. When the squeegee body 1 is disposed vertically as shown in FIG. 3, the center O of curvature of the protuberance 3 extends substantially horizontally. The protuberance 3 is continuously connected with the squeegeeing face 1a at a boundary portion 4.

The squeegee body 1 has two mounting holes 5 and is mounted on the holder 2 via a retainer plate 7 by inserting a machine screw 6 through each of the mounting holes 5. As shown in FIG. 3, a mouth edge 5a of the mounting hole 5 is projected outwardly through about 20 to 40 μm from the squeegeeing face 1a and has an axially outer portion 5a' and an axially inner portion 5a". When the squeegee body 1 is gripped between the holder 2 and the retainer plate 7 by the machine screws 6, the projecting mouth edge 5a of the mounting hole 5 is crushed such that the squeegee body 1 and the retainer plate 7 are made integral with each other. As a result, loosening of the machine screws 6 can be prevented. Since the axially inner portion 5a" projects radially inwardly from a peripheral surface 5b of the mounting hole 5, the mouth edge 5a is likely to be deformed axially inwardly at the time of its crushing, so that the mouth edge 5a is deformed substantially flat by fastening the machine screws 6 and thus, the squeegee body 1 is fixedly interposed between the holder 2 and the retainer plate 7.

Figure 5:
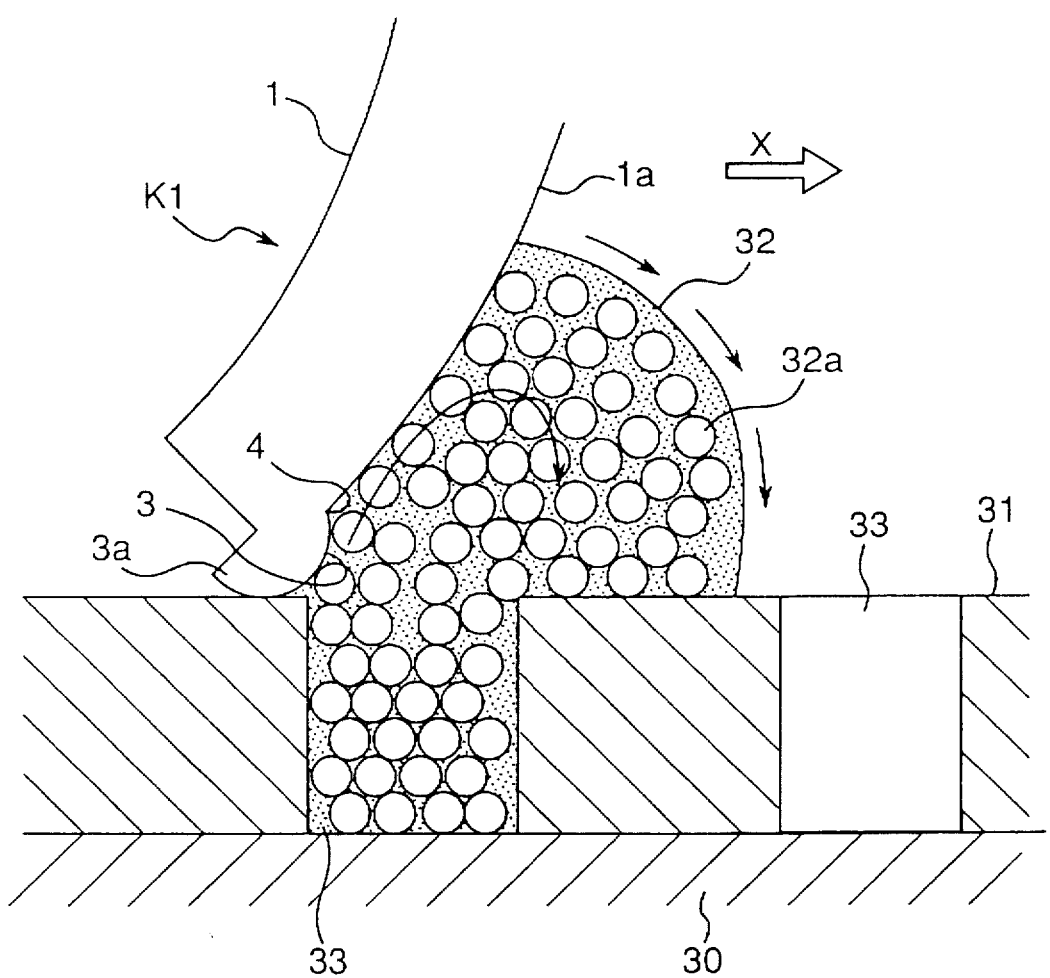
FIG. 5 is a sectional view showing a printing process utilizing the squeegee of FIG. 3.

As shown in FIG. 5, when the squeegee K1 of the above described arrangement is displaced in the travelling direction X of the squeegee K1 while being tilted to a desired angle of, for example, 45° by slightly deflecting the squeegee K1 such that vicinity of a top of the protuberance 3 is brought into contact with a screen mask 31 depressed against a printed-wiring board 30, solder paste 32 is scraped by the protuberance 3 while being smoothly rolled from an upper curved surface of the protuberance 3 towards the boundary portion 4, so that the solder paste 32 is filled into openings 33 of the screen mask 31 so as to be printed on the printed-wiring board 30. Meanwhile, at this time, since a thickness t1 of the squeegee body 1 at the free end 1b is larger than a thickness t2 of the remaining portion of the squeegee body 1 as shown in FIG. 3, the protuberance 3 is least likely to be deformed by repulsion force of the solder paste 32. Accordingly, such a phenomenon also can be prevented in which the solder paste 32 remains on the surface of the screen mask 31 without being scraped by the protuberance 3.

Figure 6:
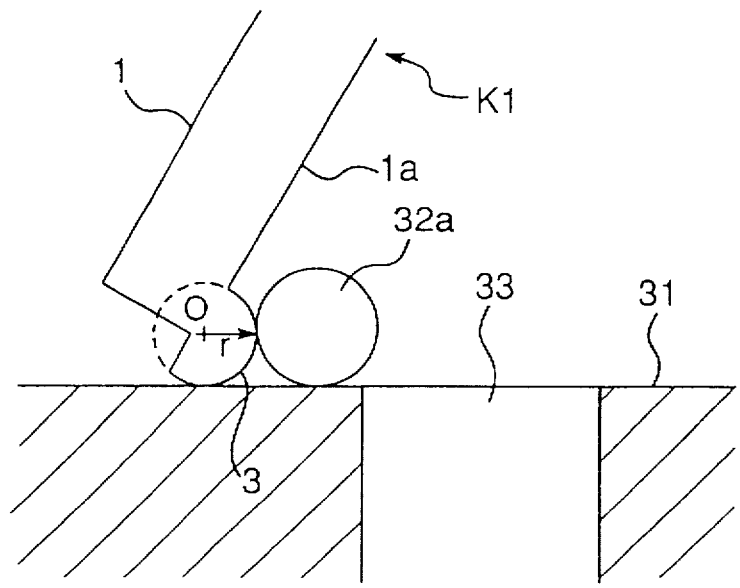
FIG. 6 is a sectional view showing a protuberance of the squeegee of FIG. 3 in comparison with a solder particle larger than the protuberance.
Figure 7:
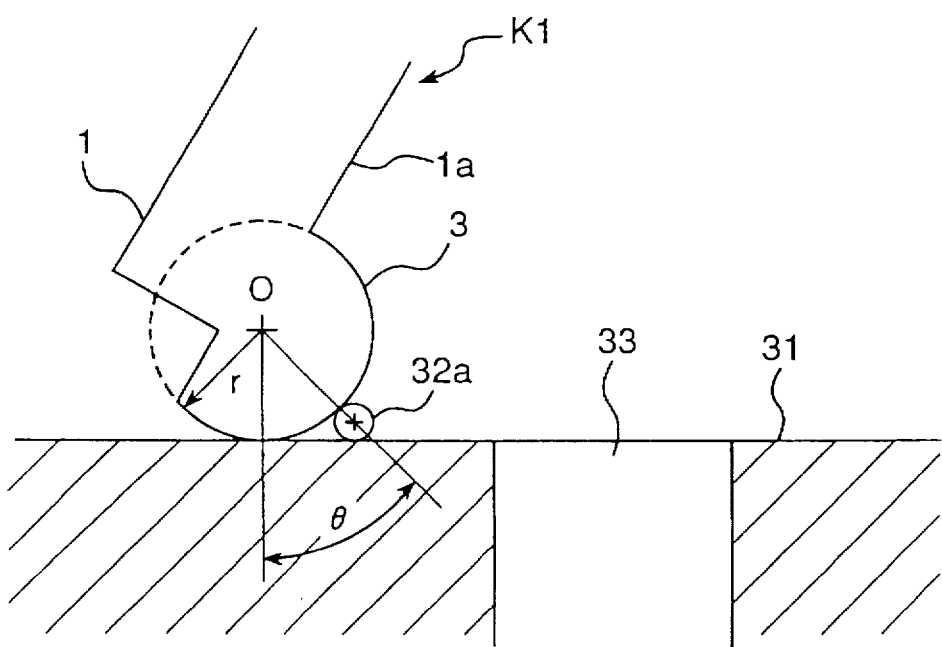
FIG. 7 is a sectional view showing another protuberance of the squeegee of FIG. 3 in comparison with a solder particle smaller than the protuberance.

For example, the thickness t1 of the squeegee body 1 at the free end 1b is set at 300 μm, while the thickness t2 of the remaining portion of the squeegee body 1 is set at 260 μm. Meanwhile, in case solder particles 32a of the solder paste 32 have an average diameter of 20 μm, the radius r of curvature of the protuberance 3 is desirably so set as to be less than about 60 μm and larger than 20 μm and is set at about 40 μm in this embodiment. If the radius r of curvature of the protuberance 3 is less than 20 μm, the protuberance 3 and the solder particle 32a push each other in parallel with the surface of the screen mask 31 as shown in FIG. 6, so that the solder particle 32a is not depressed into the opening 33 and is inclined to ascend along the squeegeeing face 1a of the squeegee body 1. On the other hand, if the radius r of curvature of the protuberance 3 is larger than 60 μm, a contact angle θ between the protuberance 3 and the solder particle 32a exceeds 45° as shown in FIG. 7, so that the protuberance 3 rises onto the solder particle 32a and thus, the solder paste 32 is insufficiently scraped by the protuberance 3. As described above, the radius r of curvature of the protuberance 3 is desirably set in accordance with average particle diameter of the solder paste 32 to be used and may be not less than the average particle diameter of the solder paste 32 but not more than six times the average particle diameter of the solder paste 32. If the radius r of curvature of the protuberance 3 is desirably set at four times the average particle diameter of the solder paste 32, squeegeeing can be performed effectively.

Figure 8A:
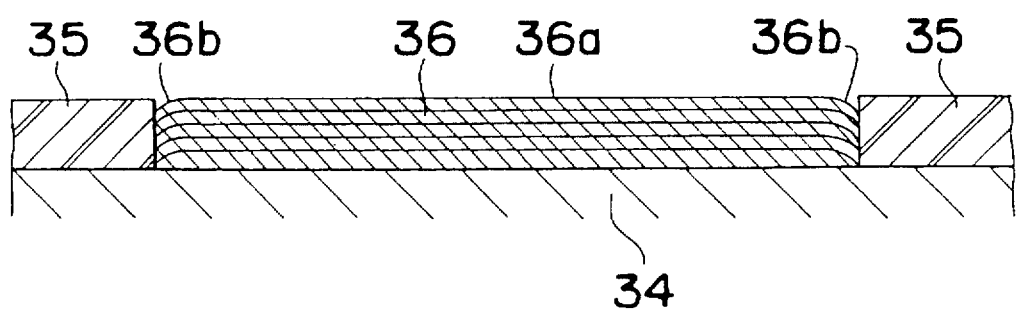
FIGS. 8A and 8B are sectional views showing operational steps of electroforming process of the squeegee body of FIG. 3.
Figure 8B:
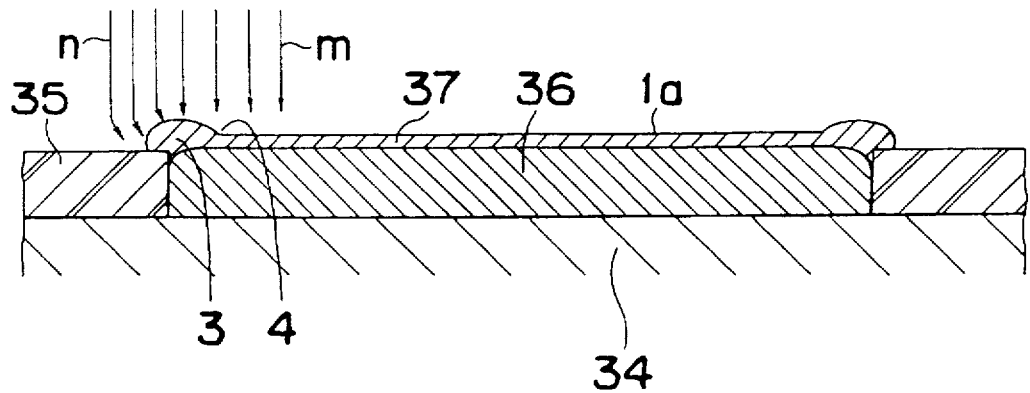

The squeegee body 1 can be produced by electroforming process as shown in FIGS. 8A and 8B. Initially, a filmy photoresist is placed on a surface of an electroforming matrix 34 or liquid photoresist is uniformly applied to the surface of the electroforming matrix 34 so as to be dried. Subsequently, a pattern film is brought into close contact with the photoresist and then, is subjected to irradiation of radiation energy such as electron rays and ultraviolet rays so as to be cured for printing. Thereafter, by performing a development step and a drying step in a known manner, a photoresist film 35 is formed to a thickness of, e.g., 260 μm by patterning as shown in FIG. 8A.

Then, the electroforming matrix 34 is put in an electroforming tank such as a bath of sulfamic acid nickel or the like so as to be subjected to primary electroforming of nickel or nickel-cobalt alloy such that metal 36 is electrodeposited to a thickness substantially equal to that of the photoresist film 35 on portions of the surface of the electroforming matrix 34, which are not covered by the photoresist film 35. At this time, the electrodeposited metal 36 grows initially at its central portion 36a distant from the from the photoresist film 35 and growth of end portions 36b of the electrodeposited metal 36 abutting on the photoresist film 35 is apt to be delayed than the central portion 36a. Each of the end portions 36b of the electrodeposited metal 36 formed through such growth as described above has a convexly arcuate shape.

Subsequently, by secondary electroforming, electrodeposited metal 37 is integrally formed on the primary electrodeposited metal 36. At this time, at end portions of the electrodeposited metal 37 close to the photoresist film 35, the electrodeposited metal 37 is electrodeposited not only by proceeding straightforwardly as shown by the arrow m in FIG. 8B but by travelling curvedly along the surface of the photoresist film 35 as shown by the arrow n in FIG. 8B. As a result, each of the end portions of the electrodeposited metal 37 overhangs the surface of the photoresist film 35 slightly so as to form the protuberance 3 having the convexly curved sectional shape and the flat squeegeeing face 1a is formed on the surface of the electrodeposited metal 37 continuously with the protuberance 3 at the boundary portion 4. Meanwhile, the mounting holes 5 can also be formed simultaneously by this electroforming. After second electroforming, the integral electrodeposited metals 36 and 37 and the photoresist film 35 are separated from the electroforming matrix 34 and then, the photoresist film 35 is removed from the integral electrodeposited metals 36 and 37. As a result, the electroformed squeegee body 1 formed by the integral electrodeposited metals 36 and 37 is obtained.

Figure 9:
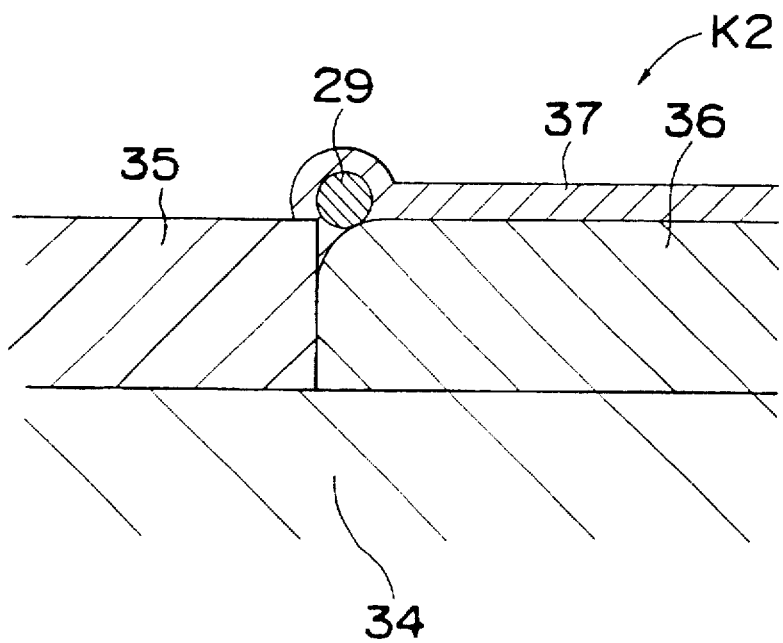
FIG. 9 is a sectional view showing an operational step of electroforming process of a squeegee body of a squeegee according to a second embodiment of the present invention.

FIG. 9 shows an operational step of electroforming of the squeegee body 1 of a squeegee K2 according to a second embodiment of the present invention. A metal wire 29 such as an iron wire, a copper wire, a nickel wire, a chromium wire and a nichrome wire is placed on each of the end portions 36b of the electrodeposited metal 36 so as to be tensioned. By performing secondary electroforming in this state, the electrodeposited metal 37 is integrally formed on the metal wire 29 so as to cover the surface of the metal wire 29. In this case, the radius r of curvature of the convexly curved sectional shape of the protuberance 3 can be set at a desired dimension so as to be reduced in scatter. In addition, since the metal wire 29 acts as the electroforming matrix 34, uniform electroforming can be performed by utilizing linearity of the metal wire 29 and thus, the protuberance 3 having high linearity can be obtained.

In case the metal wire 29 is made of soft material, for example, tin, lead and copper and the electrodeposited metal 37 is made of material harder than the metal wire 29, e.g., nickel and nickel-cobalt alloy, cushioning characteristics of the electrodeposited metal 37 can be upgraded. Therefore, during squeegeeing, it is possible to advantageously lessen local wear of the electrodeposited metal 37 forming the squeegeeing face 1a, which wear is caused by impact applied to the electrodeposited metal 37 at the time the electrodeposited metal 37 falls into or is lifted from the openings 33 of the screen mask 31.

In the above first and second embodiments of the present invention, the squeegee body 1 is produced by primary electroforming and secondary electroforming.

However, by merely increasing electroforming period, the squeegee body 1 having the above mentioned convexly curved sectional shape can be obtained by only primary electroforming. Meanwhile, the squeegee body 1 can also be produced by etching.

Figure 10:
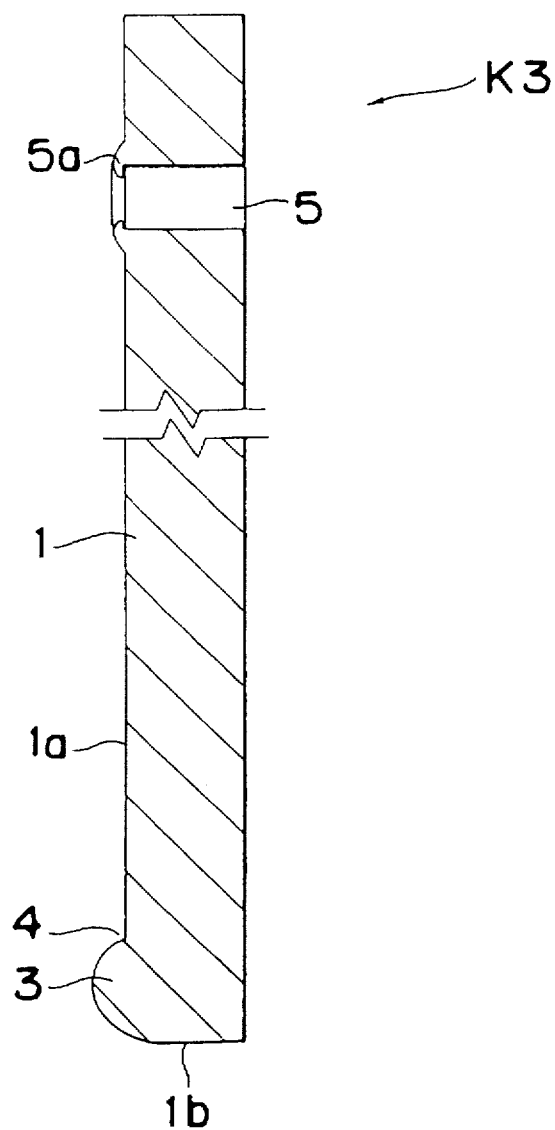
FIG. 10 is a vertical sectional view of a squeegee body of a squeegee according to a third embodiment of the present invention.

FIG. 10 shows the squeegee body 1 of a squeegee K3 according to a third embodiment of the present invention. In the squeegee K3, the overhang portion 3a protruding from the free end 1b of the squeegee body 1 of the squeegee K1 is eliminated. Since other constructions of the squeegee K3 are the same as those of the squeegee K1, the description is abbreviated for the sake of brevity.

In accordance with the first to third embodiments of the present invention, since the protuberance 3 having the convexly curved sectional shape is formed at the pressing edge of the squeegee body 1, printing property of the solder paste can be upgraded by improving rolling property of the solder paste and excellent squeegeeing can be performed without improper scraping of the solder paste.

Figure 11:
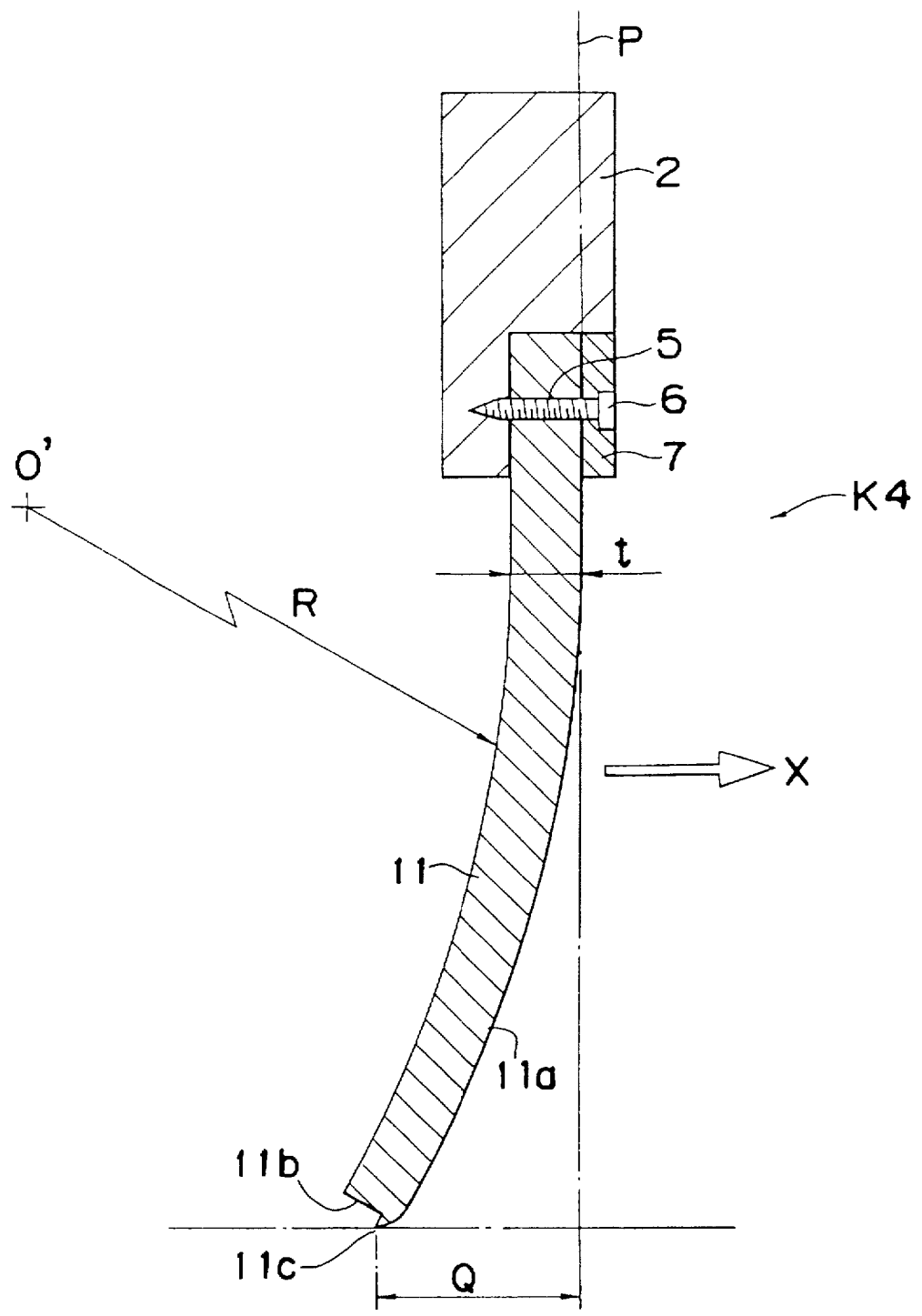
FIG. 11 is a vertical sectional view of a squeegee according to a fourth embodiment of the present invention.
Figure 12:
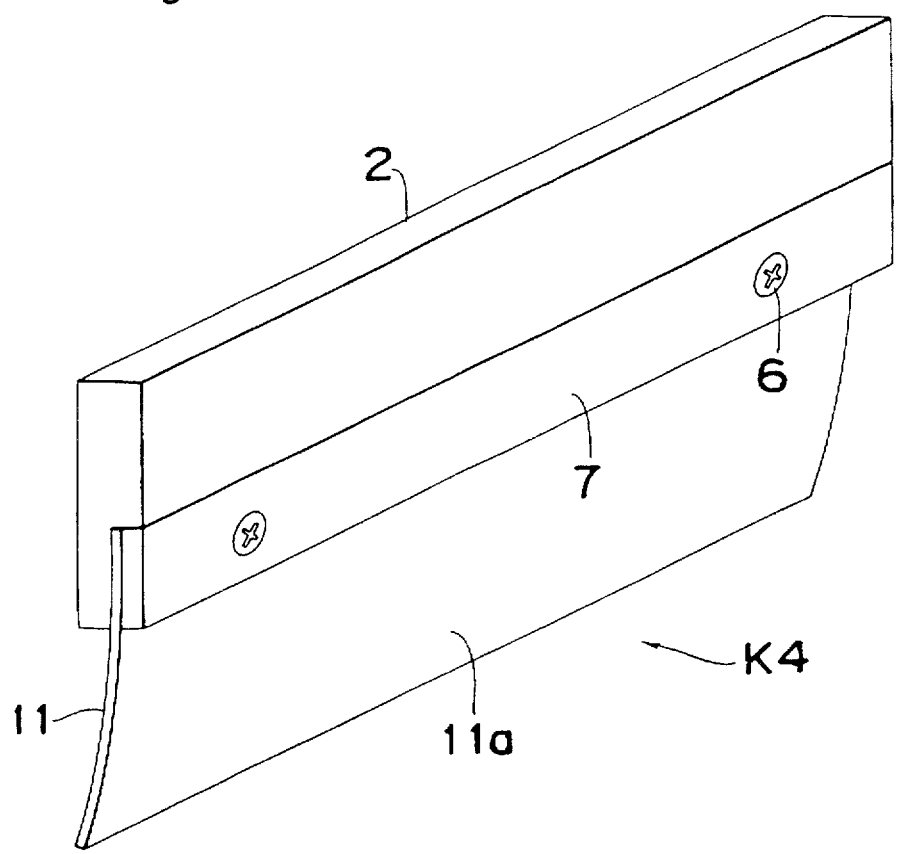
FIG. 12 is a perspective view of the squeegee of FIG. 11.
Figure 13:
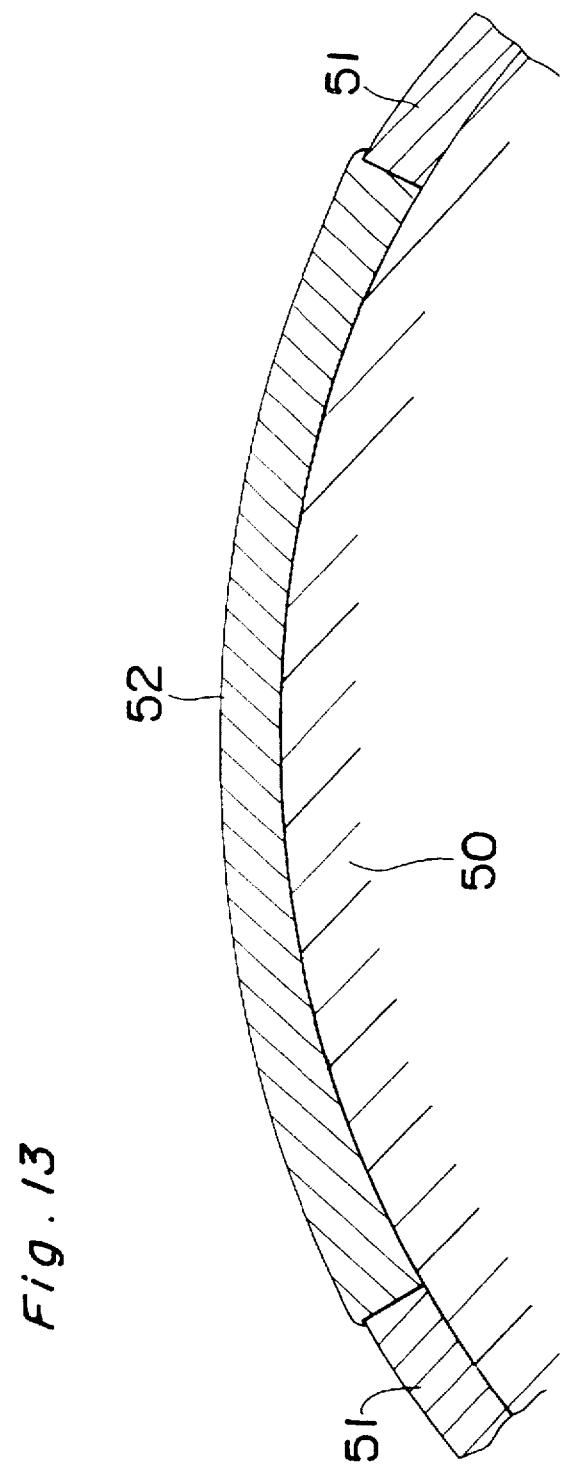
FIG. 13 is a view showing an operational step of electroforming process of a squeegee of the squeegee of FIG. 11.

Meanwhile, FIGS. 11 to 13 show a squeegee K4 according to a fourth embodiment of the present invention. In the squeegee K4, a squeegee body 11 having a squeegeeing face 11a, a free end 11b and a pressing edge 11c is formed by an elongated metal sheet in the same manner as the squeegee body 1 of the squeegee K1. The squeegeeing face 11a as a whole is curved convexly such that the squeegee body 11 has a radius R of curvature and a center O' of curvature. For example, a thickness t of the squeegee body 11 is 300 μm, the radius R of curvature is 150 mm and the squeegee body 11 has a height of 30 mm. Although not specifically shown, the mounting hole 5 of the squeegee body 11 has the projecting mouth edge 5a in the same manner as the squeegee body 1 of the squeegee K1. In a state where the squeegee K4 is disposed vertically as shown in FIG. 11, the center O' of curvature of the squeegee body 11 extends substantially horizontally and a distance Q between a vertical line P tangent to an upper end portion of the squeegeeing face 11a and the pressing edge 11c of the squeegee body 11 is about 1.1 mm. Therefore, the pressing edge 11c of the squeegee body 11 is rearwardly spaced from the vertical line P the distance Q larger than the thickness t of the squeegee body 11. In case the pressing edge 11c has a rectangular shape, the distance Q may be not less than the thickness t of the squeegee body 11. However, if the distance Q reaches not less than five times the thickness t of the squeegee body 11, it becomes difficult to mount the squeegee body 11 on the holder 2.

The squeegee body 11 can be produced by electroforming process as shown, for example, in FIG. 13. Initially, a filmy photoresist is placed on a surface of an electroforming matrix 50 having a convexly arcuate sectional shape or liquid photoresist is uniformly applied to the surface of the electroforming matrix 50 so as to be dried. Subsequently, a patten film is brought into close contact with the photoresist and is subjected to irradiation of radiation energy such as electron rays and ultraviolet rays so as to be cured for printing. Thereafter, by performing a development step and a drying step in a known manner, a photoresist film 51 having a thickness of, e.g., 300 μm is formed by patterning as shown in FIG. 13.

Then, the electroforming matrix 50 is put into an electroforming tank such as a bath of sulfamic acid nickel or the like so as to be subjected to electroforming of nickel or nickel-cobalt alloy such that metal 52 is electrodeposited to a thickness substantially equal to that of the photoresist film 51 on portions of the surface of the electroforming matrix 50, which are not covered by the photoresist film 51. After electroforming, the electrodeposited metal 52 and the photoresist film 51 are separated from the electroforming matrix 50 and then, the photoresist film 51 is removed from the electrodeposited metal 52. As a result, the curved squeegee body 11 formed by the electrodeposited metal 52 is obtained.

In the fourth embodiment, by using the electroforming matrix 50 having the convexly arcuate sectional shape, the curved squeegee body 11 is obtained. Alternatively, for example, if current density is changed during electroforming so as to produce internal stress in the squeegee body 11, the squeegee body 11 may also be curved as a whole by utilizing strain generated in the squeegee body 11 by the internal stress after separation of the electrodeposited metal 52 and the photoresist film 51 from the electroforming matrix 50. Furthermore, if the squeegee body 11 is of an arrangement in which a dull electroforming layer obtained by primary electroforming and a lustrous electroforming layer obtained by secondary electroforming are integrally laminated on each other, brightener in the lustrous electroforming layer changes electrodeposition stress into compressive stress and thus, the squeegee body 11 as a whole can be formed curvedly. Meanwhile, the squeegee body 11 may also be produced by etching in place of electroforming so as to be subsequently formed curvedly by pressing. It is needless to say that the metal sheet itself may be subjected to blanking by a press so as to obtain the squeegee body 11. Furthermore, in the fourth embodiment, the squeegee body 11 is curved as a whole. However, only a portion of the squeegee body 11, which is used for mounting the squeegee body 11 on the holder 2, may also be formed flat.

In accordance with the fourth embodiment of the present invention, the squeegeeing face 11a of the squeegee body 11 as a whole is curved convexly. Therefore, when squeegee K4 is set on the screen mask 31, the squeegee K4 can be at all times brought into a state effective for squeegeeing such that the pressing edge 11c of the squeegee body 11 deviates from the upper end portion of the squeegee body 11 in the direction opposite to the travelling direction X of the squeegee K4, thereby resulting in reliable setting of the squeegee K4.

What is claimed is:

1. A squeegee for screen printing solder paste, comprising:

a squeegee body which is formed by a metal sheet, a squeegeeing face and a convexly curved pressing edge on a bottom end of the squeegeeing face;

wherein the convexly curved pressing edge is formed integrally with the squeegee body so as to be made of a material identical with that of the squeegee body and is formed by a protuberance.

2. A squeegee as claimed in claim 1, wherein the protuberance is continuously connected with the squeegeeing face at a boundary portion.

3. A squeegee as claimed in claim 1, wherein a radius of curvature of the convexly curved pressing edge is not less than an average particle diameter of solder paste.

4. A squeegee as claimed in claim 1, wherein the squeegee body is formed by an electroforming process.

5. A squeegee as claimed in claim 1, wherein mounting holes are formed on an upper end of the squeegeeing face of the squeegee body for mounting a squeegee holder.

6. A squeegee as claimed in claim 5, wherein crushable projections are formed on the mouth edge of the mounting holes so that the squeegee body may be integrally connected with a squeegee holder.

7. A squeegee as claimed in claim 1, wherein the squeegee body has a thickness center, and wherein the protuberance has a center of curvature which is located away from the squeegee body thickness center in the direction of the squeegee face.

8. A squeegee for screen printing, comprising:

a squeegee body which is formed by a metal sheet and which has a squeegeeing face curved convexly as a whole;

wherein when the squeegee is set for squeegeeing such that the squeegeeing face is oriented in a travelling direction of the squeegee, a center of curvature of the squeegeeing face extends substantially in the travelling direction.

9. A squeegee as claimed in claim 8, wherein mounting holes are formed on an upper portion of the squeegeeing face of the squeegee body for mounting a squeegee holder.

10. A squeegee as claimed in claim 9, wherein crushable projections are formed on the mouth edge of the mounting holes so that the squeegee body may be integrally connected with a squeegee holder.

* * * * *